United States Patent
Oba

(10) Patent No.: US 11,930,708 B2
(45) Date of Patent: Mar. 12, 2024

(54) THERMOELECTRIC GENERATION MODULE

(71) Applicant: KELK Ltd., Kanagawa (JP)

(72) Inventor: Masakazu Oba, Kanagawa (JP)

(73) Assignee: KELK Ltd., Kanagawa (JP)

( * ) Notice: Subject to any disclaimer, the term of this patent is extended or adjusted under 35 U.S.C. 154(b) by 33 days.

(21) Appl. No.: 17/360,712

(22) Filed: Jun. 28, 2021

(65) Prior Publication Data

US 2022/0005997 A1   Jan. 6, 2022

(30) Foreign Application Priority Data

Jul. 3, 2020   (JP) .................................. 2020-115893

(51) Int. Cl.
  *H10N 10/17*   (2023.01)
  *H10N 10/01*   (2023.01)
  *H10N 10/854*  (2023.01)

(52) U.S. Cl.
  CPC ............. *H10N 10/17* (2023.02); *H10N 10/01* (2023.02); *H10N 10/854* (2023.02)

(58) Field of Classification Search
  CPC ......... H01L 35/32; H01L 35/20; H01L 35/34; H01L 35/10; H10N 10/17; H10N 10/854; H10N 10/01
  See application file for complete search history.

(56) References Cited

U.S. PATENT DOCUMENTS

| | | | | |
|---|---|---|---|---|
| 4,170,819 A | * | 10/1979 | Peter ...................... | H05K 1/115 29/853 |
| 2011/0155450 A1 | * | 6/2011 | Suzuki .................. | G06F 1/1633 174/263 |
| 2013/0139524 A1 | * | 6/2013 | Kim ........................ | F25B 21/02 62/3.7 |
| 2015/0034138 A1 | * | 2/2015 | Himmer .................. | H01L 35/32 136/205 |
| 2017/0141281 A1 | * | 5/2017 | Makino .................... | H01L 35/30 |

FOREIGN PATENT DOCUMENTS

JP   2017152715   8/2017

* cited by examiner

*Primary Examiner* — Devina Pillay
(74) *Attorney, Agent, or Firm* — Fish & Richardson P.C.

(57) ABSTRACT

A thermoelectric generation module includes a first substrate and a second substrate, a plurality of first electrodes and second electrodes that are arranged on the first substrate and the second substrate, a thermoelectric conversion element arranged between the first electrode and the second electrode, and a terminal pin connected to the second electrode. The second substrate includes an insulator layer made of an electrical insulating material, a through-hole that penetrates the insulator layer for insertion of the terminal pin, and an annular metal layer arranged at a peripheral portion of the through-hole. A space between the terminal pin and the through-hole is sealed by solder.

19 Claims, 8 Drawing Sheets

THERMOELECTRIC GENERATION MODULE

CROSS-REFERENCE TO RELATED APPLICATION(S)

The present application claims priority to and incorporates by reference the entire contents of Japanese Patent Application No. 2020-115893 filed in Japan on Jul. 3, 2020.

BACKGROUND OF THE INVENTION

1. Field of the Invention

The present disclosure relates to a thermoelectric generation module.

2. Description of the Related Art

A thermoelectric generation module that uses a thermoelectric conversion element is known (see, e.g., JP 2017-152715 A). The thermoelectric generation module includes a thermoelectric conversion element that is arranged between a pair of substrates. In the thermoelectric generation module, when a temperature difference is applied between the substrates, electric power is generated due to Seebeck effect.

Terminals are arranged to take out the electric power generated by the thermoelectric generation module to the outside. Furthermore, in the thermoelectric generation module, the temperature difference applied between the substrates may generate water droplets on a surface of a low-temperature substrate. Therefore, an improved sealing property is desired so that the water droplets do not enter inside the thermoelectric generation module via the terminals.

SUMMARY OF THE INVENTION

It is an object of the present invention to at least partially solve the problems in the conventional technology.

According to an embodiment of the present invention, a thermoelectric generation module comprises: a pair of substrates; a plurality of electrodes that is arranged on the substrates; a thermoelectric conversion element that is arranged between a pair of the electrodes; and a terminal connected to the electrode, wherein the substrate has an insulator layer that is formed of an electrical insulating material, a through-hole that penetrates the insulator layer for insertion of the terminal, and an annular metal layer that is arranged at a peripheral portion of the through-hole, and a space between the terminal and the through-hole is sealed by solder.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments according to the present disclosure will be described below with reference to the drawings, but the present disclosure is not limited to the embodiments. Component elements according to the embodiments described below may be appropriately combined with each other. Furthermore, in some cases, some of the component elements may not be used.

In the embodiments, a positional relationship between respective portions will be described using the terms "left," "right," "front," "rear," "up," and "down." These terms indicate a relative position or orientation with respect to the center of a thermoelectric generation module 1. A left-right direction, a front-rear direction, and an up-down direction are orthogonal to each other.

Thermoelectric Generation Module

Figure 1:
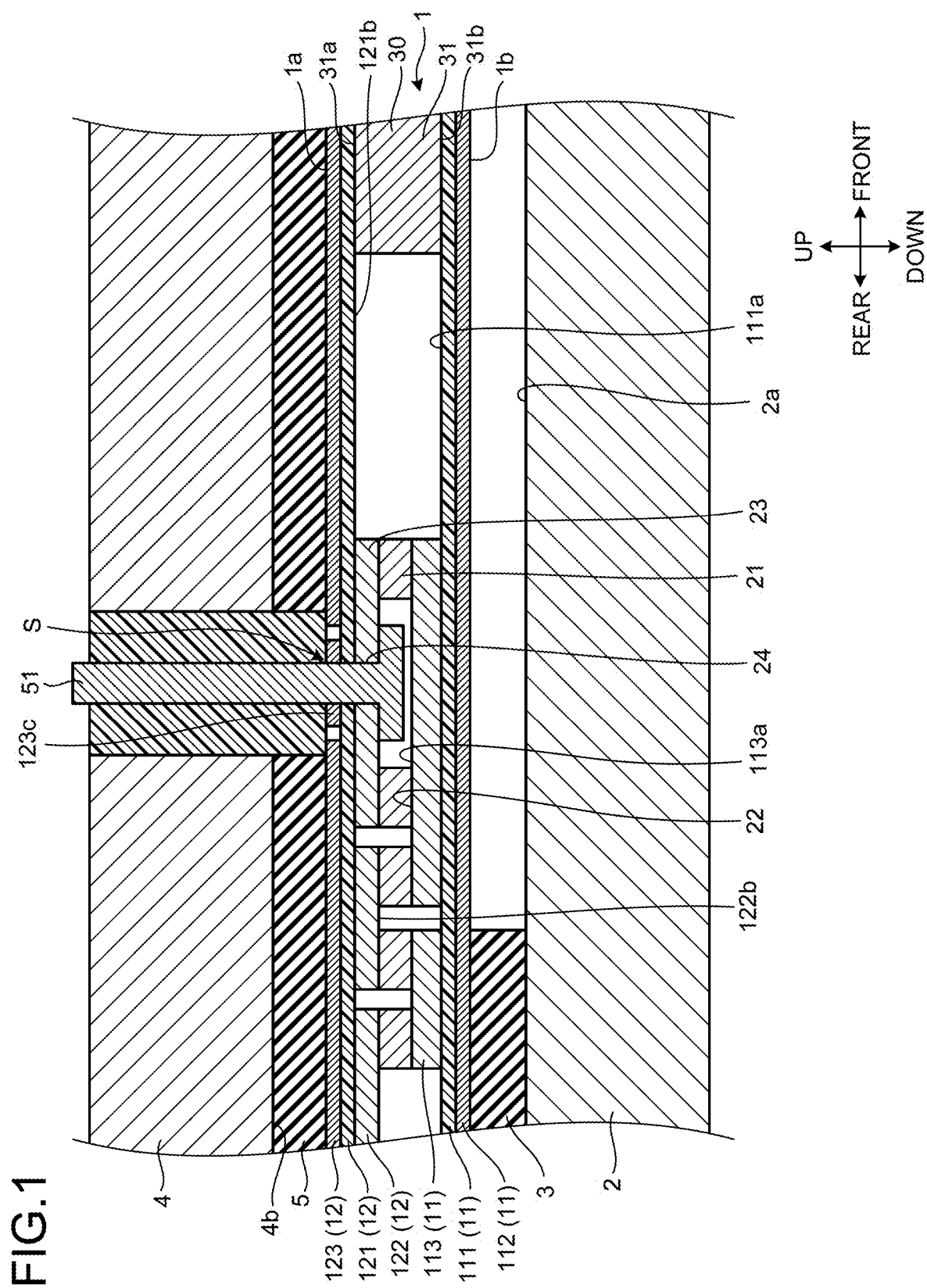
FIG. 1 is a cross-sectional view illustrating a thermoelectric generation module according to an embodiment.

FIG. 1 is a cross-sectional view illustrating the thermoelectric generation module according to an embodiment. The thermoelectric generation module 1 is held between a high-temperature plate 2 on the side of a heat source and a low-temperature plate 4 on the cooling side. When a temperature difference is applied on both sides (upper and lower sides in the figure) of the thermoelectric generation module 1 by the high-temperature plate 2 and the low-temperature plate 4, power is generated due to Seebeck effect.

The high-temperature plate 2 receives heat from the heat source and transfers the heat to the thermoelectric generation module 1. The high-temperature plate 2 is formed of a metal material such as aluminum or copper into a plate shape. The high-temperature plate 2 is arranged in contact with a lower surface 1b of the thermoelectric generation module 1 via a carbon sheet 3.

The carbon sheet 3 is a thermal conductive and electrical insulating material. The carbon sheet 3 is interposed between an upper surface 2a of the high-temperature plate 2 and the lower surface 1b of the thermoelectric generation module 1. In the present embodiment, the carbon sheet 3 is in contact with part of the upper surface 2a of the high-temperature plate 2. The carbon sheet 3 transfers the heat of the high-temperature plate 2 to the lower surface 1b of the thermoelectric generation module 1.

The low-temperature plate 4 absorbs heat from the thermoelectric generation module 1. The low-temperature plate 4 is cooled. The low-temperature plate 4 is formed of a metal material such as aluminum into a plate shape. The low-temperature plate 4 is arranged in contact with an upper surface 1a of the thermoelectric generation module 1 via a carbon sheet 5.

The carbon sheet 5 is a thermal conductive and electrical insulating material. The carbon sheet 5 is interposed between a lower surface 4b of the low-temperature plate 4 and the upper surface 1a of the thermoelectric generation module 1. In the present embodiment, the carbon sheet 5 is in contact with the entire surface of the lower surface 4b of the low-temperature plate 4. The carbon sheet 5 absorbs heat from the low-temperature plate 4 and rejects the heat to the outside.

The thermoelectric generation module 1 includes a pair of a first substrate (substrate) 11 and a second substrate (substrate) 12, a first electrode (electrode) 22 that is arranged on the first substrate (substrate) 11 and a second electrode (electrode) 23 that is arranged on the second substrate (substrate) 12, a thermoelectric conversion element 21 that is arranged between the pair of first electrode 22 and the second electrode 23, a sealing portion 30, and a terminal pin 51.

The first substrate 11 and the second substrate 12 are each formed into a rectangular shape. In the present embodiment, the first substrate 11 and the second substrate 12 each has a thickness of 2.5 μm.

The first substrate 11 and the second substrate 12 are opposed to each other through a space. In the embodiment, the second substrate 12 is arranged above the first substrate 11.

The first substrate 11 is formed of an electrical insulating material. In the embodiment, the first substrate 11 has a three-layer structure of an insulator layer 111, a metal layer 112 that is formed on a lower surface of the insulator layer 111, and a metal layer 113 that is formed on an upper surface of the insulator layer 111. The metal layer 112 and the metal layer 113 are each formed of metal foil.

Figure 2:
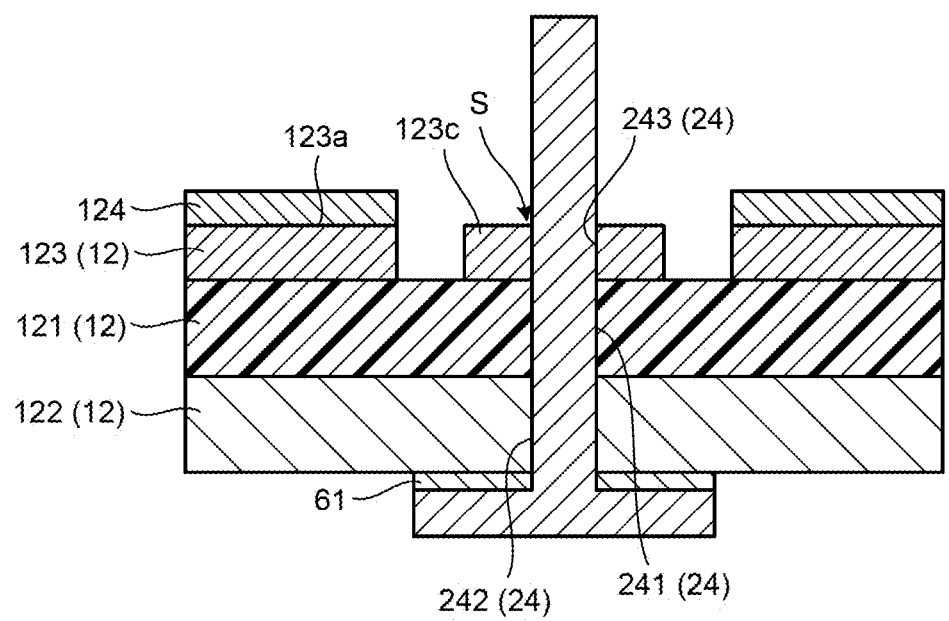
FIG. 2 is an enlarged cross-sectional view illustrating a second substrate and a terminal pin of the thermoelectric generation module according to the embodiment.
Figure 2:
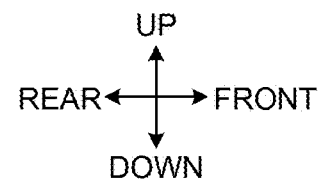

FIG. 2 is an enlarged cross-sectional view illustrating the second substrate and the terminal pin of the thermoelectric generation module according to the embodiment. The second substrate 12 is formed of an electrical insulating material. In the embodiment, the second substrate 12 has a three-layer structure of an insulator layer 121 that is formed of a polyimide sheet, a metal layer 122 that is formed on a lower surface of the insulator layer 121, and a metal layer 123 that is formed on an upper surface of the insulator layer 121. The metal layer 122 and the metal layer 123 are each formed of metal foil. The metal layer 123 has an upper surface 123a on which a nickel plated layer 124 as an electrode protection layer is formed.

The second substrate 12 has the insulator layer 121 that is formed of an electrical insulating material, a through-hole 24 that is defined through the insulator layer 121 and configure to insert the terminal pin 51 therethrough, and an annular metal layer 123c that is arranged on a peripheral edge of the through-hole 24.

An example of the insulating material forming each of the insulator layer 111 and the insulator layer 121 includes an insulator sheet containing any one of polyimides, fluorine, and epoxy resins.

An example of a metal material forming each of the metal layer 112, the metal layer 113, the metal layer 122 and the metal layer 123 includes at least one of copper (Cu), an alloy containing copper (Cu) nickel (Ni), an alloy containing nickel, stainless steel (SUS), an alloy containing stainless steel, aluminum (Al), and an alloy containing aluminum.

In the present embodiment, the insulator layer 111 and the insulator layer 121 each have a thickness of 25 μm. In the present embodiment, the metal layer 112 and the metal layer 123 each have a thickness of 300 μm. In the present embodiment, the metal layer 113 and the metal layer 122 each have a thickness of 18 μm.

One or more thermoelectric conversion elements 21 are arranged between an upper surface of the first substrate 11 and a lower surface of the second substrate 12. A plurality of the thermoelectric conversion elements 21 are connected by the first electrode 22 and the second electrode 23.

When a current is supplied to the thermoelectric conversion elements 21, the thermoelectric generation module 1 absorbs heat or generates heat due to Peltier effect. When a temperature difference is applied between the first substrate 11 and the second substrate 12, the thermoelectric generation module 1 generates power due to the Seebeck effect.

Each of thermoelectric conversion elements 21 is formed of a thermoelectric material. Examples of the thermoelectric materials forming the thermoelectric conversion element 21 include a manganese silicide-based compound (Mn—Si), a magnesium silicide-based compound (Mg—Si—Sn), skutterudite-based compound (Co—Sb), half-Heusler based compound (Zr—Ni—Sn), and bismuth-tellurium based compound (Bi—Te). The thermoelectric conversion element 21 may be composed of one selected from the manganese silicide-based compounds, magnesium silicide-based compounds, skutterudite-based compounds, half-Heusler based compounds, or bismuth-tellurium based compounds, or a combination of at least two thereof.

The thermoelectric conversion elements 21 include a p-type element 21P and an n-type element 21N. A plurality of the p-type elements 21P and a plurality of the n-type elements 21N are arranged in a predetermined surface. In a front-rear direction, the p-type elements 21P and the n-type elements 21N are arranged alternately. In a left-right direction, the p-type elements 21P and the n-type elements 21N are arranged alternately.

The first electrode 22 is provided on the upper surface of the first substrate 11. A plurality of the first electrodes 22 are provided in a predetermined surface that is parallel to the upper surface of the first substrate 11. The first electrode 22 is formed by pattern etching an upper surface 113a of the metal layer 113 of the first substrate 11 facing the inside of the thermoelectric generation module 1. The first electrode 22 arranged on the first substrate 11 has a lower surface that is a cooling surface of the thermoelectric generation module 1.

The second electrode 23 is provided on the lower surface of the second substrate 12. A plurality of the second electrodes 23 are provided in a predetermined surface parallel to the lower surface of the second substrate 12. The second electrode 23 is formed by pattern etching a lower surface 122b of the metal layer 122 of the second substrate 12 facing the inside of the thermoelectric generation module 1. The second electrode 23 arranged on the second substrate 12 has an upper surface that is a heating surface of the thermoelectric generation module 1.

The thermoelectric conversion elements 21 are bonded by solder to the first electrode 22 and the second electrode 23. More specifically, each of the first electrode 22 and the second electrode 23 are connected to each of a pair of adjacent p-type element 21P and n-type element 21N.

The first electrodes 22 and the second electrodes 23 connect a plurality of thermoelectric conversion elements 21 in series. The first electrodes 22 and the second electrodes 23 form a series circuit in which the plurality of thermoelectric conversion elements 21 is connected in series. The p-type elements 21P and the n-type elements 21N are electrically connected via the first electrodes 22 and the second electrodes 23 to form pn element pairs. A plurality of the pn element pairs are connected in series via the first electrodes 22 and the second electrodes 23 to form the series circuit including the plurality of the thermoelectric conversion elements 21.

Figure 3:
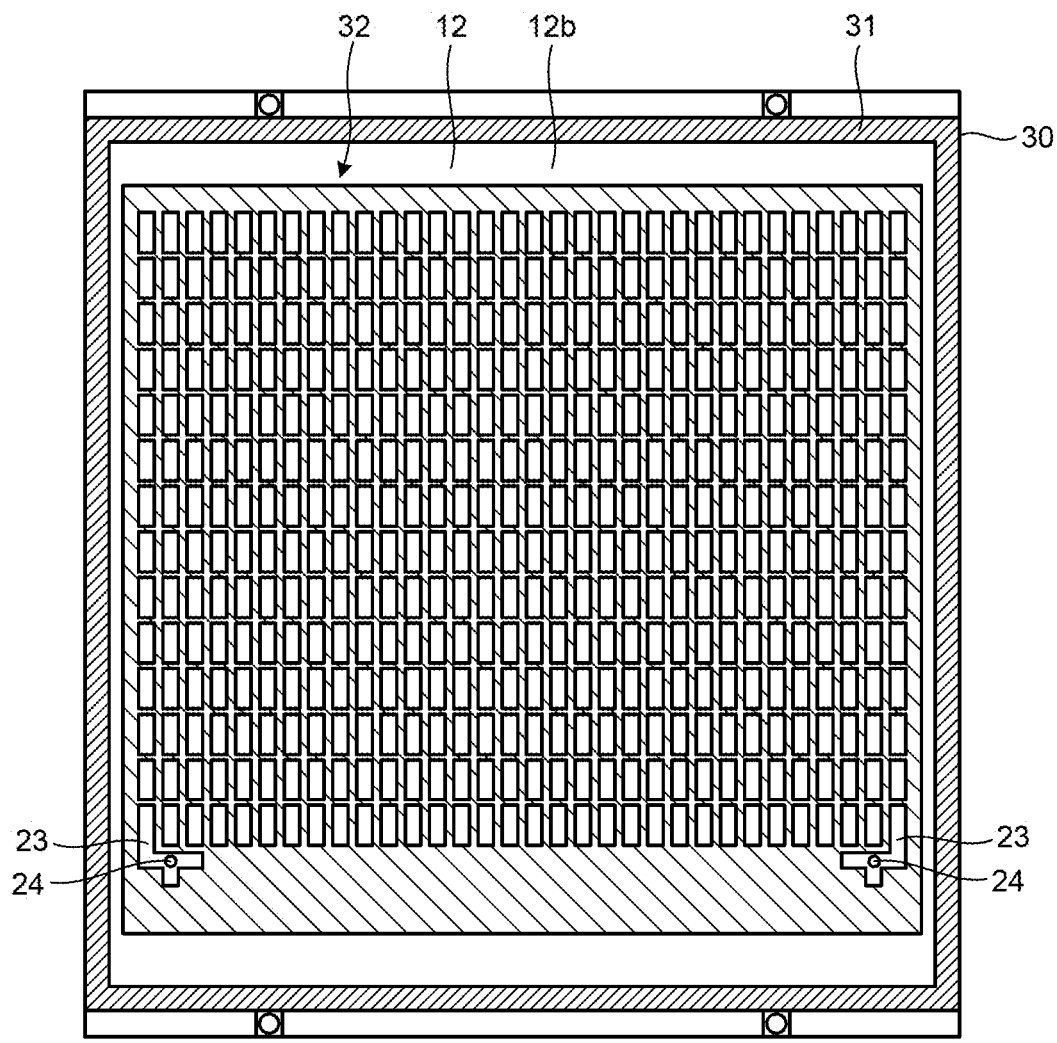
FIG. 3 is a plan view illustrating a lower surface of the second substrate of the thermoelectric generation module according to the embodiment.
Figure 3:
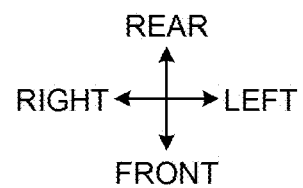
Figure 4:
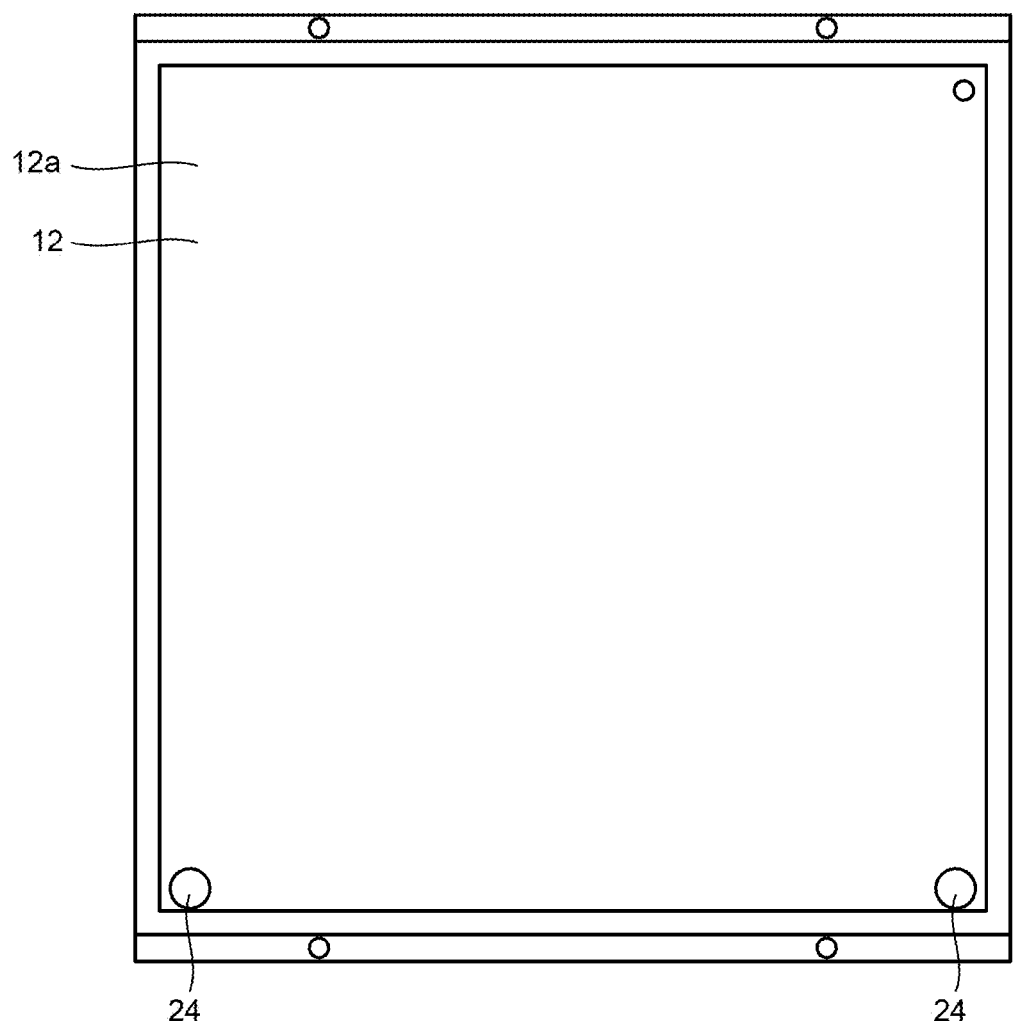
FIG. 4 is a plan view illustrating an upper surface of the second substrate of the thermoelectric generation module according to the embodiment.
Figure 4:
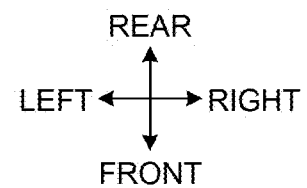

FIG. 3 is a plan view illustrating the lower surface of the second substrate of the thermoelectric generation module according to the embodiment. FIG. 4 is a plan view illustrating an upper surface of the second substrate of the thermoelectric generation module according to the embodiment. The through-holes 24 through which the terminal pins (terminals) 51 are inserted are arranged in the second electrodes 23 that correspond to a positive electrode and a negative electrode at both ends of arrangement of the thermoelectric conversion elements 21. The through-holes 24 are formed so as to vertically penetrate the second substrate 12 at positions where the second electrodes 23 corresponding to the positive electrode and the negative electrode at both ends are arranged.

Figure 5:
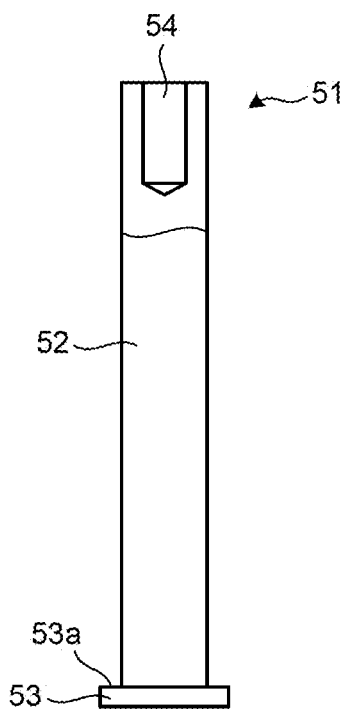
FIG. 5 is a front view illustrating the terminal pin of the thermoelectric generation module according to the embodiment.

FIG. 5 is a front view illustrating the terminal pin of the thermoelectric generation module according to the embodiment. The terminal pins 51 has a main body 52 that is formed into a columnar shape, a head 53 that is arranged at one end of the main body 52 in the axial direction, and an inner threaded portion 54 that is arranged at the other end of the main body 52 in the axial direction. The main body 52 is formed into a columnar or square columnar shape. In the present embodiment, the main body 52 is formed in a columnar shape. The head 53 is formed into a disk shape. The head 53 has a diameter that is larger than the diameter of the main body 52.

In the present embodiment, the main body 52 of the terminal pin 51 has a diameter of, for example, 4 mm. In the present embodiment, the diameter of the head 53 of the terminal pin 51 is, for example, 6 mm. In the present embodiment, the head 53 of the terminal pin 51 has a thickness of, for example, 1 mm.

The through-holes 24 penetrate the metal layer 122, the insulator layer 121, and the metal layer 123 at positions where the second electrodes 23 corresponding to the positive electrode and the negative electrode at both ends are arranged. Each of the through-hole 24 has a through-hole 242 defined in the metal layer 122, a through-hole 241 defined in the insulator layer 121, and a through-hole 243 defined in the metal layer 123. The annular metal layer 123c is left around the through-hole 24. More specifically, the annular metal layer 123c is arranged on the upper surface of the insulator layer 121 and inside the through-hole 243 so as to surround the through-hole 24.

The annular metal layer 123c is arranged so as to surround the entire circumference of the through-hole 24. In the present embodiment, the annular metal layer 123c is formed by leaving the metal layer 123 to have an annular pattern around the through-hole 24.

The through-hole 241 and the through-hole 242 have the same diameter as the diameter of the terminal pin 51. The through-hole 243 has a diameter larger than the outer shape of the terminal pin 51. Therefore, the insulator layer 121 and the annular metal layer 123c that are around the through-hole 24 are exposed from the through-hole 24. The diameters of the through-hole 241 and the through-hole 242 are, for example, 4 mm. The diameter of the through-hole 243 is, for example, 9 mm. The annular metal layer 123c has an inner diameter of, for example, 4 mm, and an outer diameter of, for example, 6 mm.

A space S between the terminal pin 51 and the through-hole 24 is sealed by solder 61. The terminal pin 51 is inserted through the through-hole 24 from below, and the second electrode 23 and the terminal pin 51 are bonded by the solder 61. More specifically, an upper surface 53a of the head 53 of the terminal pin 51 inserted through the through-hole 24 is bonded to the second electrode 23 by the solder 61.

In the second substrate 12, the annular metal layer 123c remains around the through-hole 24 for the terminal pin 51, and thereby, the solder 61 wetting around the terminal pin 51 partially wets and spreads on the annular metal layer 123c. The solder 61 forms a fillet shape on a peripheral surface of the terminal pin 51 and on the annular metal layer 123c. The fillet shape of the solder 61 closes the space S between the through-hole 24 that brings the inside of the thermoelectric generation module 1 into communication with the outside and the terminal pin 51.

The sealing portion 30 being a sealing frame is arranged on the outer peripheries of the first substrate 11 and the second substrate 12, and the thermoelectric conversion elements 21 are arranged in the sealed space.

As illustrated in FIG. 3, the sealing portion 30 is formed into a frame shape. The sealing portion 30 is arranged so as to surround the plurality of the pn element pairs aligned in a surface direction when viewed in the vertical direction. As illustrated in FIG. 1, the sealing portion 30 is arranged between the upper surface of the first substrate 11 and the lower surface of the second substrate 12, sealing a peripheral edge of the upper surface of the first substrate 11 and a peripheral edge of the lower surface of the second substrate 12. The sealing portion 30 is fixed to the upper surface of the first substrate 11 and the lower surface of the second substrate 12 by solder (not illustrated).

The sealing portion 30 has a frame portion 31 and an opening 32 that is formed in the center of the frame portion 31.

The frame portion 31 has a rectangular outer shape. The frame portion 31 has an upper surface 31a and a lower surface 31b. The upper surface 31a of the frame portion 31 is opposed to a lower surface 121b of the insulator layer 121 of the second substrate 12. The lower surface 31b of the frame portion 31 is opposed to an upper surface 111a of the insulator layer 111 of the first substrate 11.

In the present embodiment, the frame portion 31 has a thickness of 1.2 mm.

The opening 32 is an opening defined into a rectangular shape in the center of the frame portion 31. The thermoelectric conversion elements 21 are arranged in the opening 32.

The first substrate 11 and the second substrate 12 are arranged so as to vertically hold the plurality of the pn element pairs aligned in the surface direction and the sealing portion 30. The first substrate 11 and the second substrate 12 each have a size large enough to cover the first electrode 22, the second electrode 23, and the sealing portion 30.

In the thermoelectric generation module 1 configured in this way, when heat is applied to the side of the second substrate 12 and the side of the first substrate 11 is cooled with cooling water or the like, an electromotive force is generated due to a temperature difference, and a current flows when a load (not illustrated) is connected between a pair of lead wires (not illustrated). In other words, power can be drawn by applying a temperature difference to both sides (upper side and lower side in the figure) of the thermoelectric generation module 1.

Sealing method by using solder and functions Next, a method of sealing the terminal pin 51 and the through-hole 24 by using the solder 61 and the functions will be described. The terminal pin 51 is inserted through the through-hole 24 from below, and the second electrode 23 and the terminal pin 51 are bonded by the solder 61. More specifically, the upper surface 53a of the head 53 of the terminal pin 51 inserted through the through-hole 24 is brought into contact with the second electrode 23. To the upper surface 53a of the head 53 of the terminal pin 51, the solder 61 is applied. In such a state, firing is performed, and the second electrode 23 and the terminal pin 51 are bonded by solder. Only the through-holes 24 for the terminal pins 51 have circular openings on the upper surface side of the second substrate 12 to which the thermoelectric conversion elements 21 are bonded by solder. Therefore, a short circuit between the positive electrode and the negative electrode is suppressed on the upper surface side of the second substrate 12.

Figure 6:
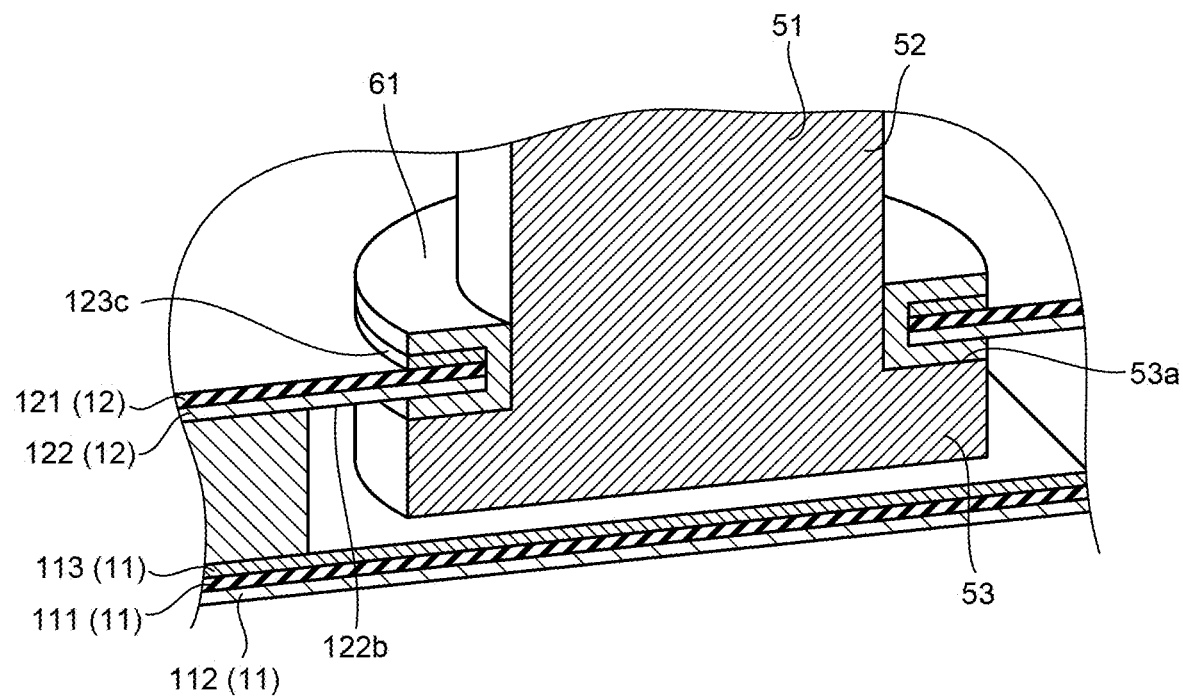
FIG. 6 is an enlarged cross-sectional view illustrating the terminal pin and solder in the thermoelectric generation module according to the embodiment.
Figure 7:
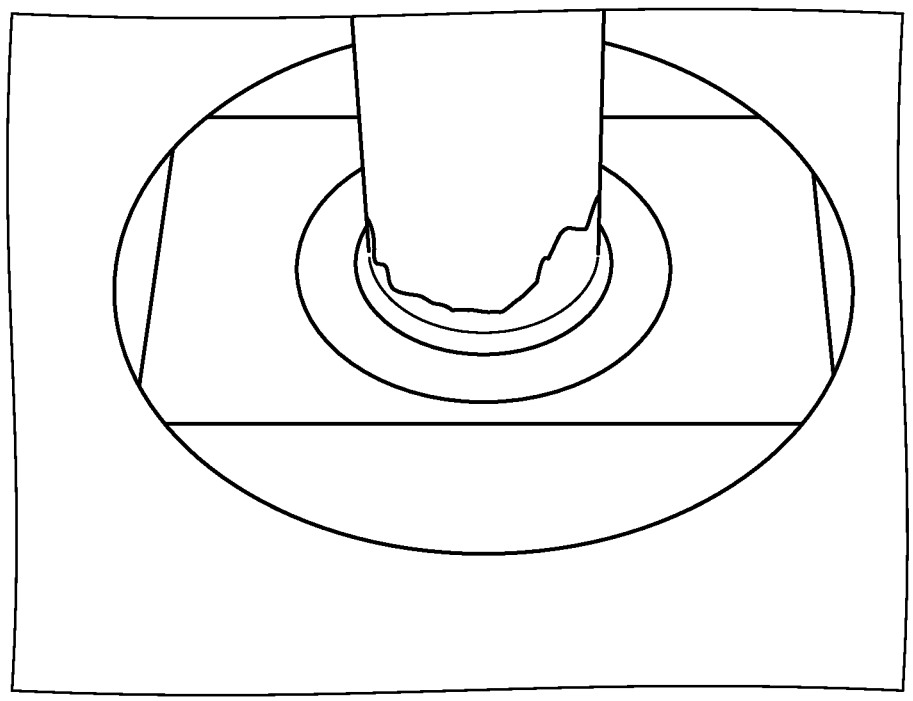
FIG. 7 is a view showing the terminal pin and the solder in the thermoelectric generation module according to the embodiment.

FIG. 6 is an enlarged cross-sectional view illustrating the terminal pin and the solder in the thermoelectric generation module according to the embodiment. FIG. 7 is a view showing the terminal pin and the solder in the thermoelectric generation module according to the embodiment. As illustrated in FIGS. 6 and 7, in the second substrate 12, the annular metal layer 123c is left around the through-hole 24 for the terminal pin 51. In the second substrate 12, the solder 61 wetting around the terminal pin 51 partially wets and spreads on the annular metal layer 123c. Thus, the solder 61 forms the fillet shape on the peripheral surface of the terminal pin 51 and on the annular metal layer 123c. The annular metal layer 123c and the terminal pin 51 are bonded by the solder 61 formed into the fillet shape so as to cover the space S between the terminal pin 51 and the through-hole 24. The rest of the solder 61 wetting around the terminal pin 51 wets and spreads around the terminal pin 51. In this way, the solder 61 formed into the fillet shape closes the space S between the through-hole 24 that brings the inside of the thermoelectric generation module 1 into communication with the outside and the terminal pin 51, and the sealing property is improved.

Effects

As described above, in the present embodiment, the second substrate 12 has the through-hole 24 that is defined through the insulator layer 121 and configure to insert the terminal pin 51 therethrough, and the annular metal layer 123c that is arranged on the peripheral edge of the through-hole 24. In the present embodiment, the pattern of the annular metal layer 123c is left around the through-hole 24 for the terminal pin 51. In the present embodiment, the space S between the terminal pin 51 and the through-hole 24 is sealed by the solder 61. In the present embodiment, the annular metal layer 123c is left on the insulator layer 121. In the present embodiment, it is possible for the solder 61 to wet and spread on the annular metal layer 123c, thereby enabling the solder 61 to wet and spread at the peripheral edge of the through-hole 24 in the insulator layer 121. Therefore, according to the present embodiment, it is possible for the metal layer 123 and the terminal pin 51 to be bonded by the solder 61 so as to cover the space S between the terminal pin 51 and the through-hole 24. In the present embodiment, it is possible to close the space S between the through-hole 24 that brings the inside of the thermoelectric generation module 1 into communication with the outside and the terminal pin 51. As described above, in the present embodiment, it is possible to improve the sealing property at a lead-out portion of the terminal pin 51 from the thermoelectric generation module 1.

In the present embodiment, only the through-holes 24 for the terminal pins 51 have circular openings on the upper surface side of the second substrate 12 to which the thermoelectric conversion elements 21 are bonded by solder. According to the present embodiment, it is possible to suppress the short circuit between the positive electrode and the negative electrode on the upper surface side of the second substrate 12.

In the present embodiment, the solder 61 forms the fillet shape. According to the present embodiment, it is possible to prevent a hole from which solder flux is discharged from bringing the inside of the thermoelectric generation module 1 into communication with the outside through the space S. According to the present embodiment, it is possible to improve the sealing property of the through-hole 24 for the terminal pin 51.

In the present embodiment, the insulator layer 121 is formed of a material containing at least one of polyimides, fluorine, and epoxy resins. In the present embodiment, it is possible for the solder 61 to wet and spread on the insulator layer 121 on which the solder 61 does not wet and spread, via the annular metal layer 123c.

In the present embodiment, the metal layer 123 including the annular metal layer 123c is formed of a material containing at least one of copper, nickel, stainless steel, and aluminum. In the present embodiment, it is possible for the solder 61 to wet and spread on the annular metal layer 123c.

Figure 8:
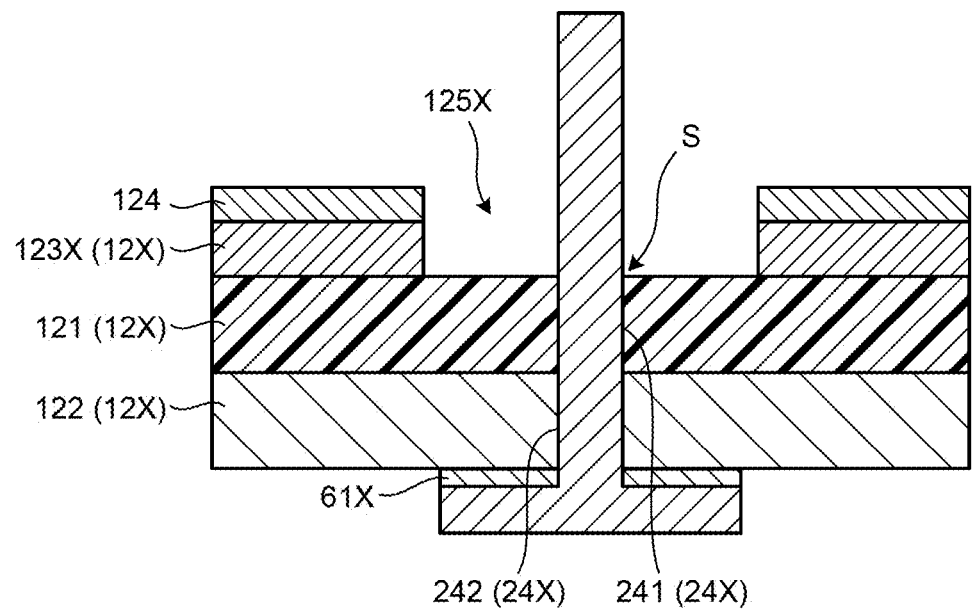
FIG. 8 is an enlarged cross-sectional view illustrating a second substrate and a terminal pin of a conventional thermoelectric generation module.
Figure 9:
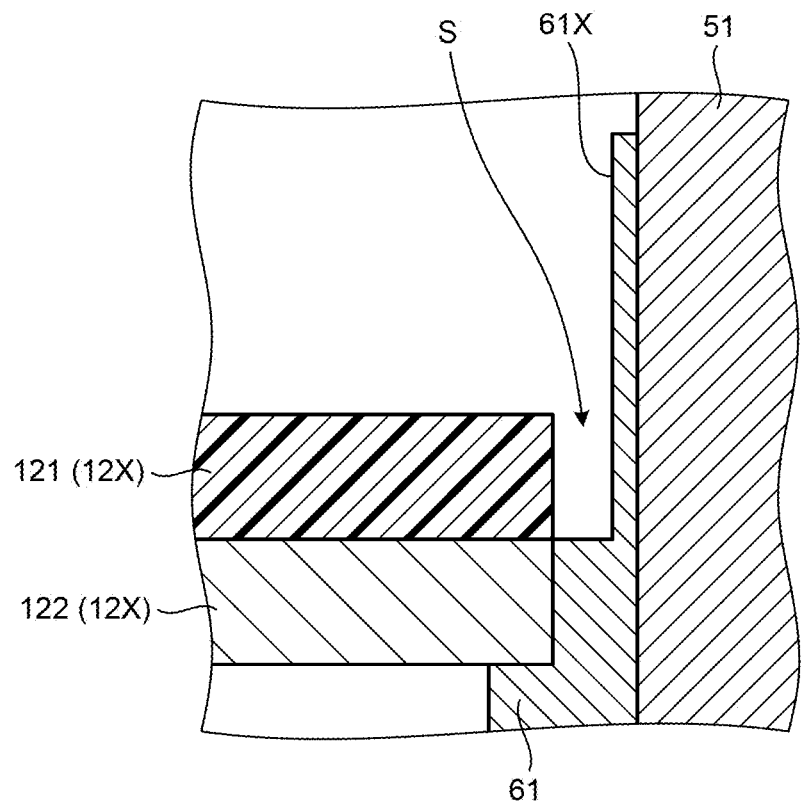
FIG. 9 is a partial enlarged view of FIG. 8.
Figure 10:
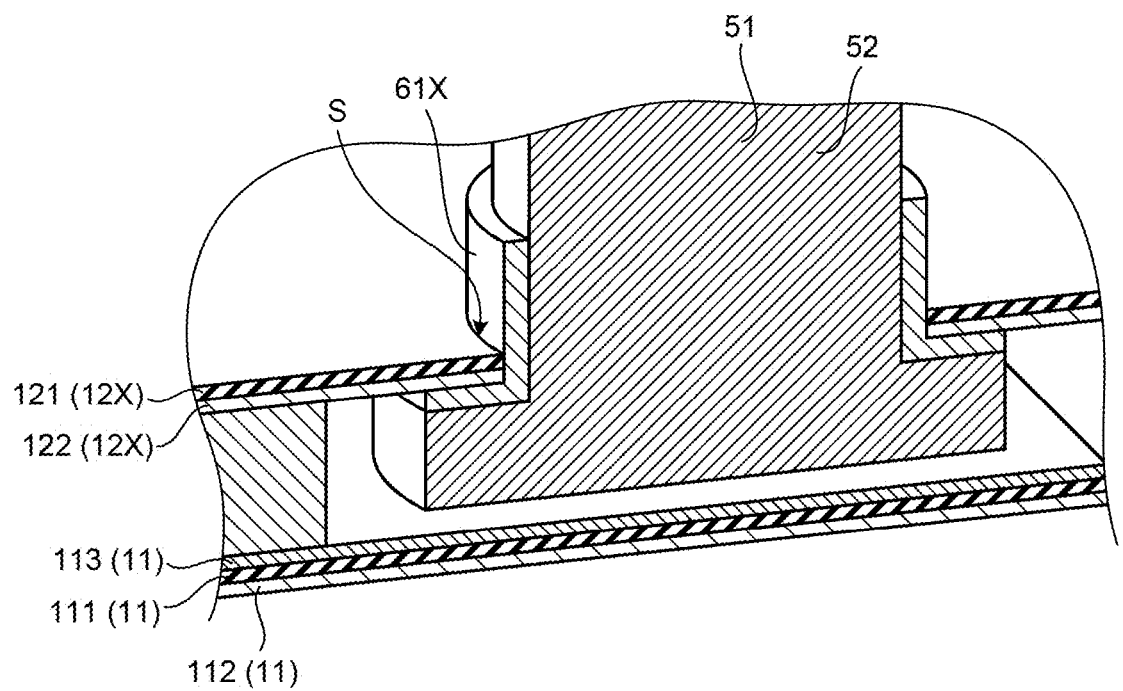
FIG. 10 is an enlarged cross-sectional view illustrating the terminal pin and solder in the conventional thermoelectric generation module.

Meanwhile, a conventional thermoelectric generation module will be described with reference to FIGS. 8 to 10. FIG. 8 is an enlarged cross-sectional view illustrating a second substrate and a terminal pin of a conventional thermoelectric generation module. FIG. 9 is a partial enlarged view of FIG. 8. FIG. 10 is an enlarged cross-sectional view illustrating the terminal pin and solder in the conventional thermoelectric generation module. In the conventional thermoelectric generation module, the annular metal layer 123c is not left around a through-hole 24X for the terminal pin 51. The annular metal layer 123c is not left around the through-hole 24X, and thus, the through-hole 24X has a two-layer structure of a through-hole 241 and a through-hole 242. An opening 125X is defined in a metal layer 123X, and thus, the second substrate 12X has two layers of an insulator layer 121 and a metal layer 122, around the terminal pin 51. When the terminal pin 51 is bonded to a second electrode 23 by solder, the metal layer 122 and the terminal pin 51 are boned by solder, but the insulator layer 121 and the terminal pin 51 are not bonded by solder. Therefore, a space S is generated around the terminal pin 51. More specifically, in the second substrate 12X, the annular metal layer 123c is not left around the through-hole 24X for the terminal pin 51, and thus, the solder 61X wetting around the terminal pin 51 does not wet and spread on the insulator layer 121 but wets and spreads along the terminal pin 51. Therefore, the solder 61X does not form a fillet shape. In some cases, in the conventional thermoelectric generation modules, the solder 61X is formed into a non-uniform ant-nest shape. As described above, in the conventional thermoelectric generation module, the space S around the through-hole 24 that brings the inside into communication with the outside may not be filled, and there is room for improvement in the sealing property.

According to the present disclosure, the sealing property can be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A thermoelectric generation module comprising:
a pair of substrates;
a plurality of electrodes that are arranged on the pair of substrates;
a thermoelectric conversion element that is arranged between a pair of electrodes among the plurality of electrodes; and
a terminal that is connected to an electrode of the pair of electrodes, the terminal passing through a substrate of the pair of substrates,
wherein the substrate defines a through-hole that receives the terminal, the substrate including:
an insulator layer that is made of an electrical insulating material, the through-hole extending through the insulator layer, and
an annular metal layer that is in contact with the insulator layer and arranged at a peripheral portion of the through-hole,
wherein the thermoelectric generation module further comprises a solder that covers a space between the terminal and the through-hole,
wherein the terminal comprises:
a main body having a columnar shape that extends in an axial direction, the main body passing through the through-hole and extending outside a top surface of the substrate in the axial direction, and
a head disposed at an end of the main body and disposed at a bottom surface of the substrate opposite to the top surface of the substrate in the axial direction,
wherein the solder has a fillet shape disposed over the main body and the annular metal layer, and
wherein the solder is in contact with the annular metal layer and the main body.

2. The thermoelectric generation module according to claim 1, wherein the solder is disposed on a peripheral surface of the terminal and on the annular metal layer.

3. The thermoelectric generation module according to claim 1, wherein the insulator layer includes at least one of polyimides, fluorine, or epoxy resins.

4. The thermoelectric generation module according to claim 1, wherein the annular metal layer includes at least one of copper, nickel, stainless steel, or aluminum.

5. The thermoelectric generation module according to claim 1, wherein the head has a disk shape, and
wherein a diameter of the head is greater than a diameter of the main body.

6. The thermoelectric generation module according to claim 1, wherein the solder is disposed between the bottom surface of the substrate and a top surface of the head.

7. The thermoelectric generation module according to claim 1, wherein the main body is spaced apart from an inner circumferential surface of the insulator layer and an inner circumferential surface of the annular metal layer, and
wherein the inner circumferential surface of the insulator layer and the inner circumferential surface of the annular metal layer surround the through-hole.

8. The thermoelectric generation module according to claim 1, wherein the solder extends in a radial direction along a top surface of the head facing the bottom surface of the substrate.

9. The thermoelectric generation module according to claim 8, wherein the solder further extends in the axial direction along the main body and covers a portion of a circumferential surface of the main body.

10. The thermoelectric generation module according to claim 9, wherein the solder further extends in the radial direction along a top surface of the annular metal layer that is disposed outside the insulator layer.

11. The thermoelectric generation module according to claim 1, wherein end portions of the insulator layer and the annular metal layer are spaced apart from an outer circumferential surface of the main body.

12. The thermoelectric generation module according to claim 11, wherein the solder is disposed in a gap defined between the outer circumferential surface of the main body and the end portions,
wherein the solder covers the end portions and extends along a top surface of the annular metal layer.

13. The thermoelectric generation module according to claim 1, wherein the solder is in contact with an inner circumferential surface of the annular metal layer, an inner circumferential surface of the insulator layer, and an outer circumferential surface of the main body.

14. The thermoelectric generation module according to claim 13, wherein the inner circumferential surfaces of the annular metal layer and the insulator layer are flush with each other and surround the through-hole.

15. A thermoelectric generation module comprising:
a pair of substrates;
a plurality of electrodes that are arranged on the pair of substrates;
a thermoelectric conversion element that is arranged between a pair of electrodes among the plurality of electrodes; and
a terminal that is connected to an electrode of the pair of electrodes, the terminal passing through a substrate of the pair of substrates,
wherein the substrate defines a through-hole that receives the terminal, the substrate including:
an insulator layer that is made of an electrical insulating material, the through-hole extending through the insulator layer,
an annular metal layer that is in contact with the insulator layer and arranged at a peripheral portion of the through-hole,
a first metal layer that defines a top surface of the substrate, and
a second metal layer that defines a bottom surface of the substrate,
wherein the insulator layer is disposed between the first metal layer and the second metal layer,
wherein the first metal layer and the annular metal layer are in contact with the top surface of the insulator layer, the annular metal layer being separated from the first metal layer in a radial direction,
wherein the thermoelectric generation module further comprises a solder that covers a space between the terminal and the through-hole, and
wherein the terminal comprises:
a main body having a columnar shape that extends in an axial direction, the main body passing through the through-hole and extending outside the top surface of the substrate in the axial direction, and a head disposed at an end of the main body and disposed at the bottom surface of the substrate opposite to the top surface of the substrate in the axial direction.

16. The thermoelectric generation module according to claim 15, wherein the solder is disposed between the second metal layer and a top surface of the head.

17. The thermoelectric generation module according to claim 15, wherein the main body is in contact with an inner circumferential surface of the first metal layer, an inner circumferential surface of the insulator layer, and an inner circumferential surface of the annular metal layer, and
   wherein the inner circumferential surface of the first metal layer, the inner circumferential surface of the insulator layer, and the inner circumferential surface of the annular metal layer surround the through-hole.

18. A thermoelectric generation module comprising:
   a pair of substrates;
   a plurality of electrodes that are arranged on the pair of substrates;
   a thermoelectric conversion element that is arranged between a pair of electrodes among the plurality of electrodes; and
   a terminal that is connected to an electrode of the pair of electrodes, the terminal passing through a substrate of the pair of substrates,
   wherein the substrate defines a through-hole that receives the terminal, the substrate including:
      an insulator layer that is made of an electrical insulating material, the through-hole extending through the insulator layer, and
      an annular metal layer that is in contact with the insulator layer and arranged at a peripheral portion of the through-hole,
   wherein the thermoelectric generation module further comprises a solder that covers a space between the terminal and the through-hole,
   wherein the terminal comprises:
      a main body having a columnar shape that extends in an axial direction, the main body passing through the through-hole and extending outside a top surface of the substrate in the axial direction, and
      a head disposed at an end of the main body and disposed at a bottom surface of the substrate opposite to the top surface of the substrate in the axial direction,
   wherein the main body is in contact with an inner circumferential surface of the insulator layer and an inner circumferential surface of the annular metal layer, and
   wherein the inner circumferential surface of the insulator layer and the inner circumferential surface of the annular metal layer surround the through-hole.

19. The thermoelectric generation module according to claim 18, wherein the substrate further comprises:
   a first metal layer that defines the top surface of the substrate; and
   a second metal layer that defines the bottom surface of the substrate,
   wherein the insulator layer is disposed between the first metal layer and the second metal layer, and
   wherein the first metal layer and the annular metal layer are in contact with a top surface of the insulator layer, the annular metal layer being separated from the first metal layer in a radial direction.

* * * * *